United States Patent [19]
Mimura et al.

[11] Patent Number: 4,567,352
[45] Date of Patent: Jan. 28, 1986

[54] FLASHLIGHT-RADIANT APPARATUS

[75] Inventors: Yoshiki Mimura, Yokohama; Tetsuji Arai, Tachikawa; Satoru Fukuda, Kawasaki, all of Japan

[73] Assignee: Ushio Denki Kabushiki Kaisha, Tokyo, Japan

[21] Appl. No.: 582,260

[22] Filed: Feb. 22, 1984

[30] Foreign Application Priority Data

Mar. 29, 1983 [JP] Japan .................. 58-51673

[51] Int. Cl.$^4$ .................. A21B 1/00; A21B 1/22
[52] U.S. Cl. .................. 219/405; 219/347; 219/354
[58] Field of Search .......... 219/354, 347, 350, 351, 219/343, 401, 411, 488, 10.69, 388

[56] References Cited
U.S. PATENT DOCUMENTS 4,436,985 3/1984 Weber .................. 219/411 X
4,449,037 5/1984 Shibamata et al. ........ 219/10.69 X Primary Examiner—C. L. Albritton
Assistant Examiner—M. N. Lateef
Attorney, Agent, or Firm—Ziems, Walter & Shannon

[57] ABSTRACT

A flashlight-radiant apparatus is constructed of a housing defining an object-handling space and an irradiation space located adjacent to the object-handling space, a plurality of flash discharge lamps provided side by side in an upper part of the irradiation space, a gas-discharging member provided in the upper part of the irradiation space for controlling the atmosphere of the housing, and an object-supporting table movable reciprocally between the object-handling space and the irradiation space in the housing and equipped with built-in subsidiary heating. An object, for example, a silicon wafer is preheated on the object-supporting table while the object-supporting table is located in the object-handling space. The flashlight-radiant apparatus has a simple structure, enjoys a high level of handling safety, assures long service life for its flash discharge lamps, and is suitable particularly for annealing semiconductor wafers.

5 Claims, 2 Drawing Figures

FLASHLIGHT-RADIANT APPARATUS

BACKGROUND OF THE INVENTION

1. Field of the Invention

This invention relates to a flashlight-radiant apparatus suitable for use, for example, in the heat treatment of semiconductor wafers.

2. Description of the Prior Art

An ion implantation process, for example, a process in which phosphorous ions at high energy are bombarded and introduced in a semiconductor wafer made of silicon, is practiced in order to promote the crystallization of the wafer or impart useful characteristics to the wafer. Such an ion implantation however develops crystal defects in the wafer. It is thus necessary to subject the wafer to a heat treatment to anneal same so that crystal defects developed can be healed. Furthermore, it is also required to heat-treat a wafer for forming a single-crystalline silicon layer by use of a method of gas-phase epitaxial growth. Heretofore, such heat treatments of wafers have usually been carried out by heating wafers in a resistive furnace while causing an inert gas such as nitrogen gas to flow therethrough. However, the heat treatment in a resistive furnace is accompanied by such drawbacks that it requires a long heating time period, it is difficult to heat a wafer of a large surface area uniformly, it develops "warping" in a wafer, and/or it tends to cause contamination of a surface layer of a wafer. As excellent heat treatment apparatus free of such drawbacks, flashlight-radiant apparatus making use of flash discharge lamps have recently attracted engineers' attention.

Such a flashlight-radiant apparatus however requires high output flash discharge lamps and is very disadvantageous if one tries to carry out a heat treatment of a cold wafer of room temperature by heating it to a desired high temperature only with the energy applied by the flash discharge lamps to the wafer. Therefore, it is indispensable, from the practical viewpoint, to heat each wafer additionally upon heating same by a flash of light from flash discharge lamps. In order to conduct such additional heating, it is preferred to provide subsidiary heating means as a unitary member with a wafer-supporting table, to place the wafer-supporting table below flash discharge lamps and then to turn on the flash discharge lamps at one time to have the lamps to radiate a flash of light while additionally heating each wafer. In such a structure as mentioned above, the flash discharge lamps are however heated to high temperatures by heat which is generated continuously from the subsidiary heating means. Thus, use of such subsidiary heating means is accompanied by another drawback that flash discharge lamps are heated to high temperatures owing to the heat given continuously off from the subsidiary heating means, thereby deteriorating the flash discharge lamps at an early stage and hence shortening their service life considerably.

Furthermore, a flash discharge lamp is operated by applying a high voltage thereto. It is thus an important issue to assure the safety of the apparatus for high voltages. However, it is still dangerous from the standpoint of safety to handle a wafer on a supporting table placed right below flash discharge lamps.

SUMMARY OF THE INVENTION

With the foregoing in view, an object of this invention is to provide a flashlight-radiant apparatus which assures high handling safety, prevents flash discharge lamps from being reduced in service life, and is suitable for the heat treatment of a semiconductor wafer which may be of a large surface area.

In one aspect of this invention, there is thus provided a flashlight-radiant apparatus which comprises:

a housing defining an object-handling space and an irradiation space located adjacent to the object-handling space;

a plurality of flash discharge lamps provided side by side in an upper part of the irradiation space;

a gas-discharging member provided in the upper part of the irradiation space for controlling the atmosphere in the housing; and an object-supporting table movable reciprocally between the object-handling space and the irradiation space in the housing and equipped with built-in subsidiary heating means;

wherein an object supported on the object-supporting table can be preheated while the object-supporting table is located in the object-handling space.

The flashlight-radiant apparatus of this invention has a simple structure, enjoys a high level of handling safety, assures long service life for its flash discharge lamps, and is suitable particularly for annealing semiconductor wafers.

The above and other objects, features and advantages of the present invention will become apparent from the following description and the appended claims, taken in conjunction with the accompanying drawing.

DETAILED DESCRIPTION OF THE INVENTION AND PREFERRED EMBODIMENT

Figure 1:
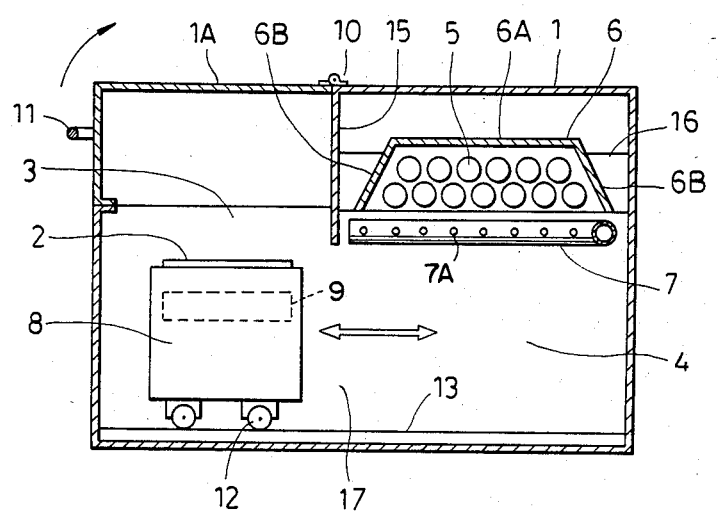
FIG. 1 is a vertical, cross-sectional, front elevation of a flashlight-radiant apparatus according to one embodiment of this invention, in which an object-supporting table is located in an object-handling space.
Figure 2:
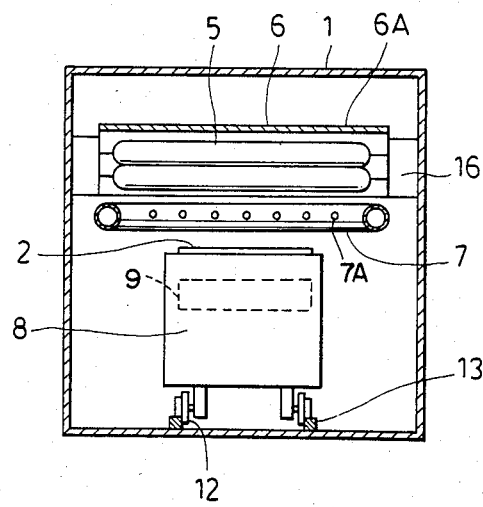
FIG. 2 is a vertical, cross-sectional, side elevation of the flashlight-radiant apparatus in which the object-supporting table is located in an irradiation space.

In FIGS. 1 and 2 of the accompanying drawing, numeral 1 indicates a housing of the flashlight-radiant apparatus. The interior of the housing 1 is divided into an object-handling space 3 and irradiation space 4, which are located adjacent to each other in the horizontal direction. Above the object-handling space 3, a lid 1A is provided openably by means of hinges 10. By opening the lid 1A, a wafer 2 which is an object to be heat-treated is placed in the apparatus and is taken out of the apparatus. Designated at numeral 11 is a handle for the lid 1A. In an upper part of the irradiation space 4, flash discharge lamps 5 each having a diameter of 10 mm and an arc length of 80 mm for example are arranged closely and parallelly in two layers to form a sort of planar flashlight source. The area of the planar flashlight source is 80 mm × 80 mm. Upwardly apart by 2 mm from the group of flash discharge lamps, there is provided an upwardly-convex reflector 6 consisting of a planar top wall protion 6A and side wall portions 6B which flare outwardly. Accordingly, each flash of light radiated from the flash discharge lamp 5 is directed downwardly. Numeral 15 indicates a partition plate provided on a top plate of the housing 1. The partition plate 15 extends downwardly and partitions the object-handling space 3 and the irradiation space 4 from each other at their upper parts only so as to form an opening 17 thereunder at the boundary between the space 3 and the space 4. Through the opening 17, an object-supporting table 8, which can move as mentioned later, is permitted to travel between the object-handling space 3 and the irradiation space 4. The flash discharge lamps 5 and the reflector 6 are mounted on mounting plates 16 which are fixed on the partition plate 15 and a plate of the housing 1. In an upper level of the irradiation space 4 but right under the planar flashlight source, a gas-discharging pipe 7 is provided so as to be arranged along the periphery of the space 4 for controlling the atmosphere in the housing 1. An atmosphere-controlling gas such as nitrogen gas, argon gas or the like is discharged from the gas-discharging pipe 7 through discharging-holes 7A thereof, for example, inwardly and upwardly toward the flash discharge lamps 5. Thereafter, the gas discharged is allowed to flow from the irradiation space 4 into the object-handling space 3 part the lower edge of the partition plate 15. The gas is then exhausted outside through an exhaust port (not illustrated) formed in an upper part of the housing 1 or the lid 1A. The supporting surface of the object-supporting table may be made of silica glass and a wafer 2 is placed on the supporting surface. Subsidiary heating means 9 is built into the object-supporting table 8, preheating the wafer 2 to about 500° C. The object-supporting table 8 runs on rails 13 by means of its wheels 12 so that it can travel reciprocatingly between the object-handling space 3 and the irradiation space 4. The object-supporting table 8 is normally located in the object-handling space 3 and moves into the irradiation space 4 only when the wafer 2 is exposed to a flash of light. The object-supporting table 8 returns to the object-handling space 3 immediately upon completion of the exposure. The distance between the wafer 2 on the object-supporting table 8 located in the irradiation space 4 and the flash discharge lamps 5 is set at about 10 mm.

A heat treatment of the wafer 2 by the flashlight-radiant apparatus of the above-mentioned construction is carried out in the following manner, for example. First of all, the lid 1A is opened and a wafer 2 to be heat-treated is then placed on the object-supporting table 8 which is located in the object-handling space 3 and has already been heated by energizing the subsidiary heating means 9. Thus, the wafer 2 is preheated to about 500° C. At this time, heat given off from the object-supporting table 8 rises upwardly through the object-handling space 3. The flash discharge lamps 5 are however not heated by the heat, because the flash discharge lamps 5 are not arranged in the upper part of the object-handling space 3 but arranged in the upper part of the irradiation space 4 which upper part is isolated from that of the object-handling space 3 with the partition plate 15. In addition, the atmosphere-controlling gas flows from the irradiation space 4 toward the object-handling space 3. Therefore, the heat radiated from the object-supporting table 8 is not allowed to spread into the irradiation space 4 even if the opening 17 remains open and is not closed. Some fine dust may enter the apparatus from the outside when the lid 1A is opened. Such fine dust is however taken outside owing to the gas stream. Therefore, the irradiation space 4 is free of floating dust and thus kept clean, thereby successfully avoiding the contamination of the wafer 2 under heat treatment. After the wafer 2 has been sufficiently preheated, the object-supporting table 8 moves from the object-handling space 3 into the irradiation space 4, where the wafer 2 is exposed to a flash of light radiated from the flash discharge lamps 5 and is thus heated. More specifically speaking, for example, at least 80% of the flashlight radiated from the plane flashlight source made up of the flash discharge lamps 5 is applied to the wafer 2. Since the wafer 2 has been mirror-finished at the surface thereof, a substantial part of the applied light is reflected back by the wafer 2. However, the thus-reflected light is reflected again by the reflector 6 and arrives again at the wafer 2. Such reflections are repeated, thereby bringing out a multiple reflection effect. Accordingly, the flashlight radiated from the plane flashlight source is utilized with extremely good efficiency to heat the wafer 2. In addition, it is possible to conduct a uniform heating even if a wafer has a still wider surface area, provided that many flash discharge lamps 5 are arranged side by side to form a plane flashlight source. Furthermore, the atmosphere-controlling gas is discharged out toward the flash discharge lamps 5. Thus, owing to the cooling effect of the atmosphere-controlling gas, each of the flash discharge lamps 5 is protected from being overheated in the course of its flashing operation. After completion of the heat treatment, the object-supporting table 8 immediately returns to the object-handling space 3. Therefore, the object-supporting table 8 is allowed to stay only for a short period of time in the irradiation space 4. Accordingly, the quantity of heat given off to the irradiation space 4 from the object-supporting table 8 during the time period is very little. Moreover, the stream of the atomsphere-controlling gas exhibits the cooling effect as mentioned above and further takes out heat from the irradiation space 4. Thus, the flash discharge lamps 5 are heated merely to a practically-ignorable extent. As a result, the flash discharge lamps 5 are successfully protected from their deterioration and their service life will not be shortened. Finally, the wafer 2 is removed from the object-supporting table 8 located in the object-handling space 3 to complete its heat treatment. The handling of the wafer 2 such as the placing of the wafer 2 on the object-supporting table 8 and its removing from the table 8 is carried out within the object-handling space 3 which is isolated from the irradiation space 4 in which the flash discharge lamps 5 and their fittings to which a high voltage is applied are located. Therefore, the apparatus is extremely safe to work with.

A specific example of operation will next be described. A silicon single-crystalline wafer of 2 inches in diameter which had been implanted at 50 KeV with phosphorus ions as a dopant at a rate of $1 \times 10^5$ ions per square centimeters was heat-treated in a flash-light-radiant apparatus of the illustrated structure by preheating at 500° C. on the object-supporting table 8 in the object-handling space 3 and subsequently exposing the wafer in the irradiation space 4 to a flashlight from the flash discharge lamps 5 operated simultaneously under conditions of an illumination energy of 1,500 joule per lamp and a pulse width of 800 microseconds. The wafer was instantaneously and completely annealed.

Having now fully described the invention, it will be apparent to one of ordinary skill in the art that many changes and modifications can be made thereto without departing from the spirit or scope of tne invention as set forth herein.

What is claimed is:

1. A flashlight-radiant apparatus comprising:

a housing defining within an object-handling space and an irradiation space located adjacent to the object-handling space;

a plurality of flash discharge lamps provided side by side in an upper part of the irradiation space;

a gas-discharging member provided in the upper part of the irradiation space for controlling the atmosphere in the housing; and an object-supporting table movable reciprocatingly between the object-handling space and the irradiation space in the housing and equipped with built-in subsidiary heating means, whereby an object supported on the object-supporting table can be preheated while the object-supporting table is located in the object-handling space.

2. A flashlight-radiant apparatus as claimed in claim 1, wherein a gas which has been discharged into the irradiation space from the gas-discharging member is then allowed to flow into the object-handling space.

3. A flashlight-radiant apparatus as claimed in claim 1, wherein an atmosphere-controlling gas is discharged from the gas-discharging member toward the flash discharge lamps for cooling same.

4. A flashlight-radiant apparatus as claimed in claim 1, wherein a substantially planar light source is constructed by the flash discharge lamps.

5. A flashlight-radiant apparatus as claimed in claim 1, wherein an upwardly-convex reflector is arranged over the flash discharge lamps.

* * * * *